(12) United States Patent
Won et al.

(10) Patent No.: US 6,667,209 B2
(45) Date of Patent: Dec. 23, 2003

(54) METHODS FOR FORMING SEMICONDUCTOR DEVICE CAPACITORS THAT INCLUDE AN ADHESIVE SPACER THAT ENSURES STABLE OPERATION

(75) Inventors: Seok-Jun Won, Seoul (KR); Yong-Kuk Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/350,766

(22) Filed: Jan. 24, 2003

(65) Prior Publication Data

US 2003/0153146 A1 Aug. 14, 2003

(30) Foreign Application Priority Data

Feb. 8, 2002 (KR) ........................................ 2002-07294

(51) Int. Cl.[7] ......................................... H01L 21/8242
(52) U.S. Cl. ........................................ 438/253; 438/396
(58) Field of Search ............................. 438/3, 239, 240, 438/253, 254, 255, 396, 397, 398

(56) References Cited

U.S. PATENT DOCUMENTS 6,458,653 B1 * 10/2002 Jang ........................... 438/253
2002/0037624 A1 * 3/2002 Mori et al. ................. 438/396
2002/0084471 A1 * 7/2002 Won et al. .................. 257/200
2002/0149049 A1 * 10/2002 Okuda ........................ 257/306

* cited by examiner

*Primary Examiner*—Jack S J Chen
(74) *Attorney, Agent, or Firm*—Mills & Onello, LLP

(57) ABSTRACT

In a method for forming capacitors of semiconductor devices, a contact plug penetrating an interlayer dielectric (ILD) is formed on a semiconductor substrate. A supporting layer, an etch stop layer, and a molding layer are sequentially formed on the semiconductor substrate where the contact plug is formed. The molding layer is patterned to form a molding pattern. At this time, the molding pattern has an opening exposing an etch stop layer over the contact plug. Next, an adhesive spacer is formed on sidewalls of the opening. The etch stop layer and the supporting layer, which are exposed through the opening where the adhesive spacer is formed, are successively patterned. Thus, the etch stop pattern and the supporting pattern are formed to expose the contact plug. A lower electrode and a sacrificial pattern are formed to sequentially fill a hole region surrounded by sidewalls of the adhesive spacer, the etch stop pattern, and the supporting pattern. After removing the molding pattern and the sacrificial pattern, the adhesive spacer is removed. At this time, the adhesive spacer is composed of a material having good adhesion and high etch selectivity with respect to the etch stop pattern and the lower electrode, preferably a titanium nitride layer.

20 Claims, 7 Drawing Sheets

METHODS FOR FORMING SEMICONDUCTOR DEVICE CAPACITORS THAT INCLUDE AN ADHESIVE SPACER THAT ENSURES STABLE OPERATION

RELATED APPLICATION

This application relies for priority upon Korean Patent Application No. 2002-07294, filed on Feb. 8, 2002, the contents of which are herein incorporated by reference in their entirety.

1. Field of the Invention

The present invention relates to methods for fabricating semiconductor devices, and more particularly to methods for forming capacitors of a cylinder shape using a molding pattern.

2. Background of the Invention

A memory semiconductor device includes a structure for storing information in each unit cell. In particular, dynamic read access memory (DRAM), which is a widely used semiconductor memory device, uses a capacitor for storing the information. Meanwhile, as semiconductor devices continue to become more highly integrated, the available capacitor area per unit cell area decreases. However, at the same time, in order to ensure stable operation in the DRAM, it is necessary to secure sufficient capacitance in the DRAM cell capacitor.

As is known to those skilled in the art, the capacitance of a capacitor is directly proportional to a dielectric constant of a dielectric layer and to the respective areas of the capacitor electrodes, and is inversely proportional to the distance between capacitor electrodes. Thus, to maximize the capacitance of the capacitor, it is required to increase the respective areas of the capacitor electrodes, to decrease the distance between the capacitor electrodes, and to use a material layer having a high dielectric constant for the dielectric layer of the capacitor.

In general, for increasing the area of the capacitor electrode, the lower electrode of the capacitor is formed into a cylinder shape. Meanwhile, techniques for decreasing the distance between the capacitor electrodes has reached technical limits due to a problem with leakage current. Thus, a technique of using a material layer with a high dielectric constant has recently attracted attention as a method for increasing the capacitance of the dielectric layer of the capacitor.

When a high dielectric constant material is used for the capacitor dielectric layer, ruthenium is preferably used as an electrode material. However, because ruthenium exhibits a poor adhesion with nitride layers or oxide layers, the lower cylindrical electrode may sink while the lower electrode is formed.

FIGS. 1 and 2 are cross-sectional views illustrating a conventional method for forming a cylindrical capacitor and various problems associated therewith.

Referring to FIG. 1, an interlayer dielectric (ILD) 10 is formed on a semiconductor substrate and a contact plug 15 is then formed to penetrate the ILD 10. A supporting layer, an etch stop layer, and a molding layer are sequentially formed on the resulting surface of the semiconductor substrate including the contact plug 15. The molding layer, the etch stop layer, and the supporting layer are successively patterned to form a molding pattern 30, an etch stop pattern 25, and a supporting pattern 20, which have an opening exposing the contact plug 15.

A lower electrode layer (not shown) and a sacrificial layer (not shown) are formed on the resultant structure where the supporting pattern 20 is formed. Thereafter, the sacrificial layer and the lower electrode layer are planarizingly etched until the molding pattern 30 is exposed, thereby forming a sacrificial pattern 40 and a lower electrode 35.

The molding pattern 30 and the supporting pattern 20 are typically formed of a silicon oxide layer, and the etch stop pattern 25 is formed of a silicon nitride layer. Also, the lower electrode 35 is composed of a material of the platinum group such as ruthenium, and the sacrificial pattern 40 is composed of an SOG material.

Referring to FIG. 2, the molding pattern 30 and the sacrificial pattern 40 are removed by a wet etching process using an etch recipe for etching an oxide layer. However, as mentioned above, adhesion of ruthenium with the silicon nitride layer is poor. Thus, while the molding pattern 30 is removed, etchant may penetrate through a space formed between the etch stop pattern 25 and the lower electrode 35. As a result, along with the molding pattern 30, the supporting pattern 20 composed of a silicon oxide layer is also etched to form an undercut region 99 under the etch stop pattern 25. The etchant may penetrate through an interface between the molding pattern 30 and the lower electrode 35, due to a poor adhesion between the ruthenium and the silicon oxide layer. The penetration of the etchant may also cause the formation of the undercut region 99.

Because of the undercut region 99, the supporting pattern 20 is not able to structurally support the lower electrode 35. As a result, the lower electrode 35 may sink or fall down during a subsequent process, such as a subsequent cleaning process, and this can have catastrophic results. In addition, the undercut region 99 is not filled during a subsequent process due to the etch stop pattern 25 covered thereon and may remain as a void.

SUMMARY OF THE INVENTION

It is therefore a feature of the present invention to provide a method for forming a capacitor of a semiconductor device capable of overcoming the above mentioned limitations of the conventional approaches.

In accordance with an aspect of the present invention, there is provided a method for forming a capacitor of a semiconductor device comprising forming an adhesive spacer having a good adhesion with an etch stop pattern, so as to prevent an etchant for removing a molding pattern from penetrating into a supporting pattern. The method comprises forming a contact plug penetrating an interlayer dielectric (ILD) on a semiconductor substrate. A supporting layer, an etch stop layer, and a molding layer are sequentially formed on the semiconductor substrate where the contact plug is formed. The molding layer is then patterned to form a molding pattern. At this time, the molding pattern has an opening that exposes the etch stop layer over the contact plug. Thereafter, an adhesive spacer is formed on sidewalls of the opening. The etch stop layer and the supporting layer, which are exposed through the opening where the adhesive spacer is formed, are successively patterned. Thus, an etch stop pattern and a supporting pattern are formed to expose the contact plug. A lower electrode is formed to cover a hole region surrounded by sidewalls of the adhesive spacer, the etch stop pattern and the supporting pattern. The molding pattern is then removed to expose an outer wall of the adhesive spacer. Next, after removing the exposed adhesive spacer, a dielectric pattern and an upper electrode are formed to cover an exposed surface of the lower electrode.

At this time, the supporting layer is formed of a silicon oxide layer, and the etch stop layer is formed of a silicon nitride layer ($Si_3N_4$) or a tantalum oxide layer ($Ta_2O_5$). The molding layer is preferably composed of a silicon oxide layer or an SOG material.

Also, the adhesive spacer is composed of a material having beneficial adhesion and an etch selectivity with respect to the etch stop pattern and the lower electrode. For this, the adhesive spacer is preferably formed of a titanium nitride layer (TiN). In addition, forming the adhesive spacer preferably comprises forming an adhesive layer on an entire surface of the semiconductor substrate including the molding pattern, and then anisotropically etching the adhesive layer to expose top surfaces of the molding pattern and the contact plug.

The etch stop pattern and the supporting pattern are preferably formed by successively anisotropic-etching the etch stop layer and the supporting layer by using the adhesive spacer and the molding pattern as an etch mask.

The lower electrode is preferably composed of one of the platinum group, such as ruthenium, rhodium, palladium, osmium, iridium, or platinum. Forming the lower electrode comprises sequentially forming a lower electrode layer and a sacrificial layer on the resultant structure where the supporting pattern is formed, and then etching the sacrificial layer and the lower electrode layer until a top surface of the molding pattern is exposed. After forming the lower electrode, a thermal process may be further applied to the lower electrode in a hydrogen ambient.

Removing the molding pattern adopts an isotropic etch process using an etch recipe having an etch selectivity with respect to the adhesive spacer and the lower electrode. The sacrificial layer is preferably removed together during the process of removing the molding pattern.

Removing the adhesive spacer adopts an isotropic etch process using an etch recipe having an etch selectivity with respect to the lower electrode and the etch stop pattern. At this time, an etchant is preferably a solution mixture of sulfuric acid ($H_2SO_4$) and hydrogen peroxide ($H_2O_2$).

The dielectric layer is preferably formed of a tantalum oxide layer. After forming the dielectric layer and the upper electrode layer, a thermal process may be further applied to the dielectric layer and the upper electrode layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
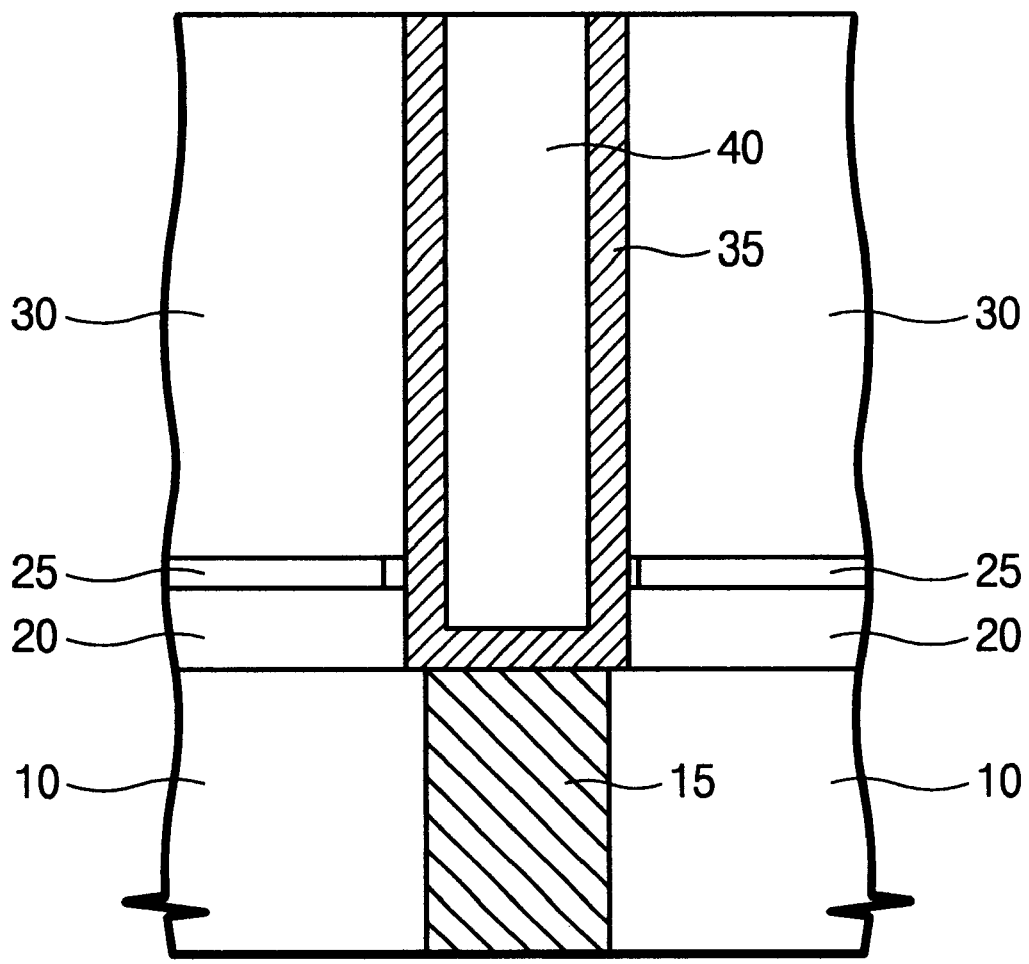
FIGS. 1 and 2 are cross-sectional views illustrating a conventional method for forming a capacitor.
Figure 2:
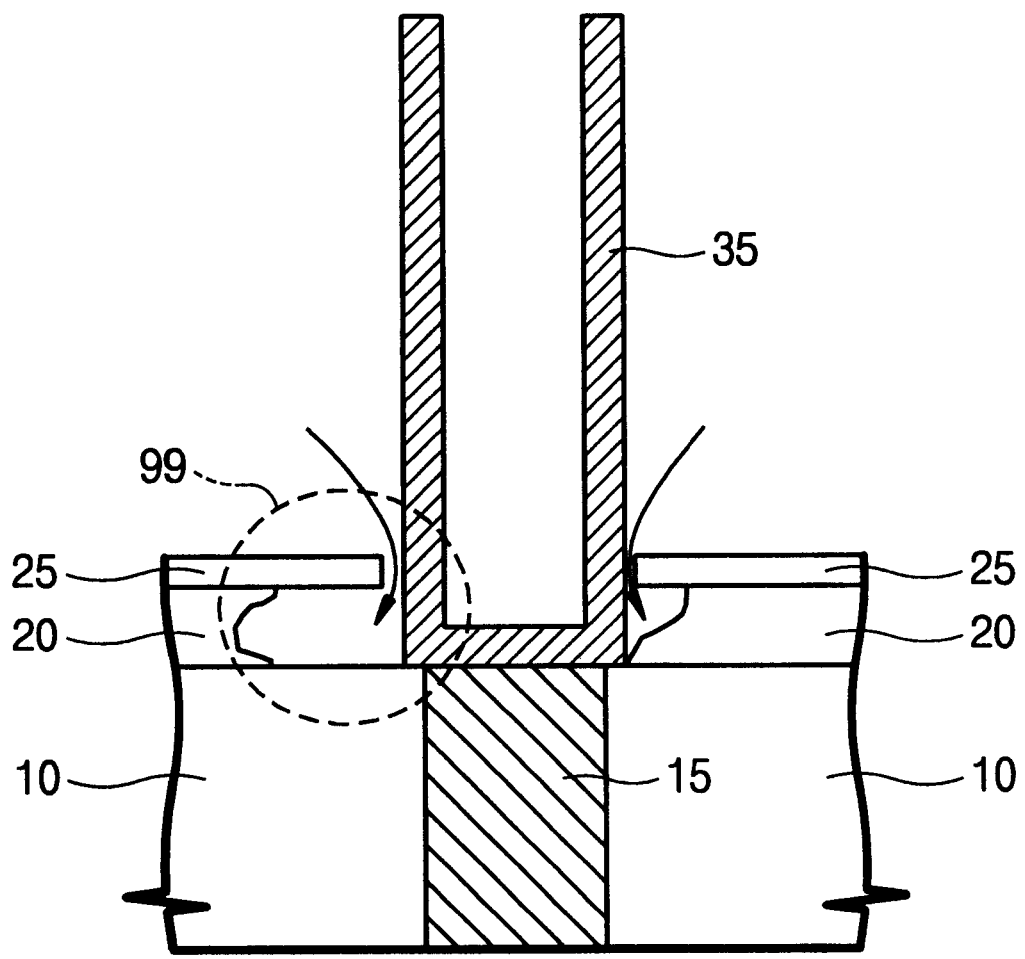

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 3 to 9 are cross-sectional views illustrating a method for forming a capacitor according to a preferred embodiment of the present invention.

Figure 3:
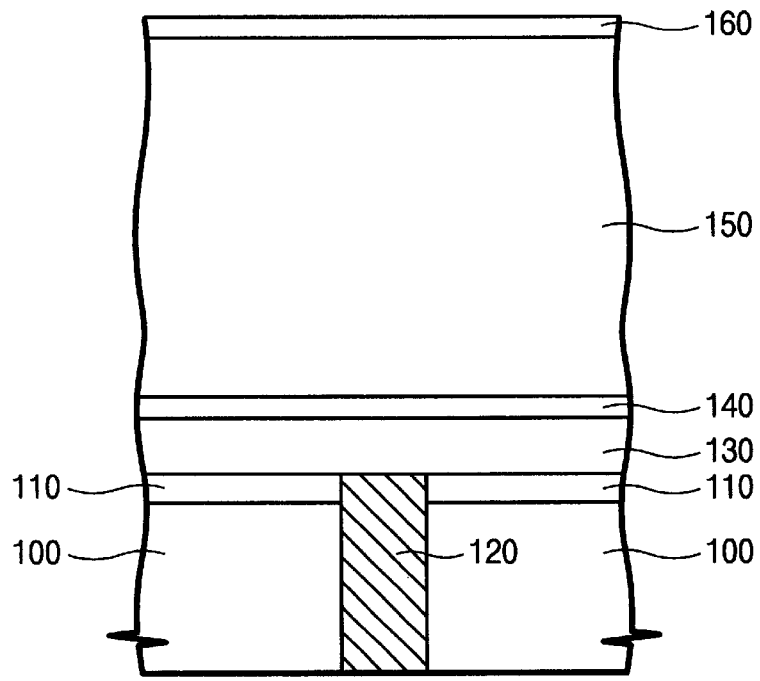
FIGS. 3 to 9 are cross-sectional views illustrating a method for forming a capacitor according to a preferred embodiment of the present invention.

Referring to FIG. 3, an interlayer dielectric (ILD) 100 and a lower etch stop layer 110 are sequentially formed on a semiconductor substrate. The ILD 100 may cover a device isolation layer (not shown) and a gate pattern (not shown), which are formed by ordinary processes. Next, a conductive contact plug 120 is formed to penetrate the lower etch stop layer 110 and the ILD 100. The contact plug 120 is formed by an ordinary process for fabricating a semiconductor device, of which detailed description will be omitted here for brevity.

Thereafter, a supporting layer 130, an etch stop layer 140, a molding layer 150, and an anti-reflecting layer 160 are sequentially formed on an entire surface of the semiconductor substrate including the contact plug 120. At this time, the molding layer 150, the etch stop layer 140, the supporting layer 130, and the anti-reflecting layer 160 will be used as a molding flask for determining an outward shape of a lower electrode, during a subsequent process for forming the lower electrode.

In more detail, the anti-reflecting layer 160 is used for convenience of a photolithographic process for forming the molding flask. For this, the anti-reflecting layer 160 is preferably formed of a silicon oxynitride layer (SiON) to a thickness of approximately 600 Å.

The molding layer 150 is a primary material layer for determining the outward shape of the lower electrode and is removed after forming the lower electrode. Thus, the molding layer 150 is formed of a silicon oxide layer, preferably a P-TEOS or SOG material layer that has a high etch rate in an etch recipe for etching an oxide layer. At this time, because the height of the molding layer 150 determines the height of the lower electrode, the height of the molding layer 150 affects the capacitance of the capacitor. The molding layer 150 is preferably formed to a height of approximately 3000 to 10000 Å.

The etch stop layer 140 is used to prevent the etching of the supporting layer 130 during the foregoing process of removing the molding layer 150. Accordingly, the etch stop layer 140 is composed of a material layer having an etch selectivity with respect to the molding layer 150, preferably a silicon nitride layer ($Si_3N_4$). Further, the etch stop layer may be formed of a silicon oxynitride layer (SiON) or a tantalum oxide layer ($Ta_2O_5$). At this time, the etch stop layer 140 is preferably formed to a thickness of approximately 300 Å.

The supporting layer 130, as described above, is a material layer for minimizing the problem that the lower electrode may sink, or fall down. For this, the supporting layer 130 is formed of an insulation layer such as high density plasma (HDP) oxide or undoped silicate glass (USG). In this case, the supporting layer 130 is preferably formed to a height of approximately 1000 Å. A subsequent thermal process may be further applied in order to improve characteristics of the supporting layer 130.

Meanwhile, the lower etch stop layer 110 is a material layer for inhibiting recess in the ILD 100 during the process of etching the etch stop layer 130 for forming the molding flask. Thus, the lower etch stop layer 100 is composed of a material having an etch selectivity with respect to an etch recipe for etching the supporting layer 130, preferably a silicon nitride layer or a silicon oxynitride layer. Also, after forming the contact plug 120 penetrating the ILD 100, the lower etch stop layer 110 may be stacked on the contact plug 120.

Figure 4:
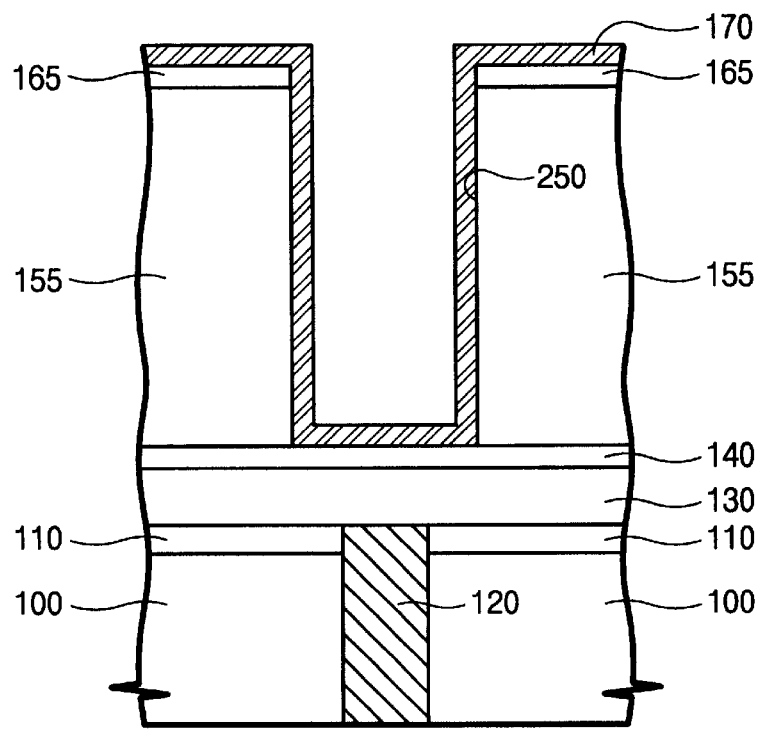

Referring to FIG. 4, the anti-reflecting layer 160 and the molding layer 150 are successively patterned to form an opening 250, which exposes the etch stop layer 140 over the contact plug 120. Thus, the anti-reflecting layer 160 and the molding layer 150 are formed into an anti-reflecting pattern 165 and a molding pattern 155, respectively. Next, an adhesive layer 170 is conformally formed on an entire surface of the resultant structure where the molding pattern 155 is formed.

The etching process for forming the anti-reflecting pattern 165 and the molding pattern 155 is performed using an anisotropic etch process. In particular, the etching process for forming the molding pattern 155 is performed by an etch recipe having an etch selectivity with respect to the etch stop layer 140.

In the preferred embodiment of the present invention, the adhesive layer 170 is a material layer for improving adhesion between the lower electrode (e.g. ruthenium) and the molding layer 150 (e.g. a silicon oxide layer) or the etch stop layer 140 (e.g. a silicon nitride layer). Thus, the adhesive layer 170 is preferably formed of titanium nitride (TiN) to a thickness of approximately 100 to 300 Å. At this time, the titanium nitride layer is preferably formed by chemical vapor deposition (CVD) using $TiCl_4$ as a source material and may be formed by atomic layer deposition (ALD). Meanwhile, the adhesive layer 170 may be composed of titanium.

Figure 5:
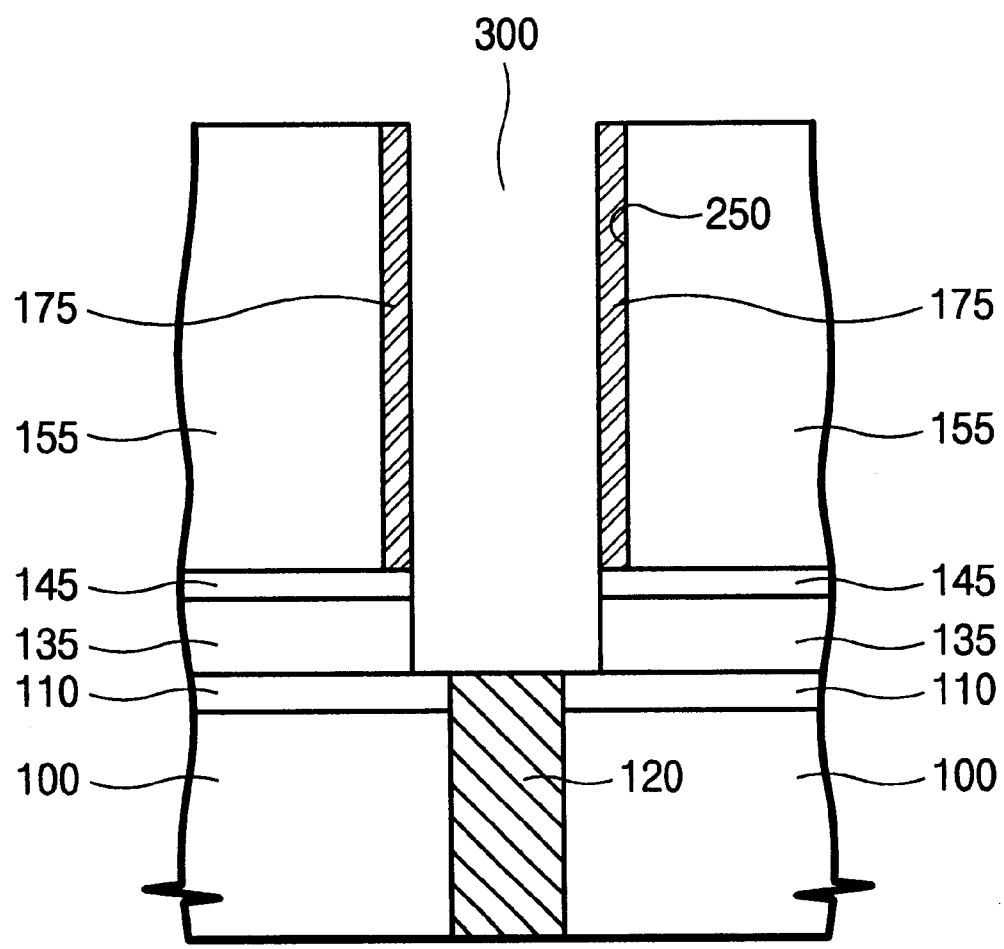

Referring to FIG. 5, the adhesive layer 170 is anisotropically etched to expose a top surface of the etch stop layer 140 at an inside of the opening 250. At this time, the adhesive layer 170 over the molding pattern 155 is also etched to expose a top surface of the anti-reflecting pattern 165. Thus, the adhesive layer 170 covering sidewalls of the opening forms an adhesive spacer 175 contacting a top surface of the etch stop layer 140.

The etch stop layer 140 and the supporting layer 130, which are exposed through the opening where the adhesive spacer 175 is formed, are successively etched using an anisotropic etch process. Thus, an etch stop pattern 145 and a supporting pattern 135 are formed to expose the contact plug 120. A top surface of the contact plug 120 is exposed through a hole region 300 surrounded by sidewalls of the supporting pattern 135, the etch stop pattern 145, and the adhesive spacer 175.

Preferably, the etching process for forming the etch stop pattern 145 and the supporting pattern 135 is performed by an anisotropic etch process using the adhesive spacer 175 and the anti-reflecting pattern 165 as an etch mask.

Also, the etch process for forming the supporting pattern 135 adopts an etch recipe having an etch selectivity with respect to the lower etch stop layer 110. Thus, even when the hole region 300 has an area greater than the contact plug 120, the ILD 100 is prevented from being recessed.

Meanwhile, the anti-reflecting pattern 165 is removed to partially recess a top surface of the molding pattern 155, during the series of etching processes for forming the adhesive spacer 175, the etch stop pattern 145, and the supporting pattern 135.

Figure 6:
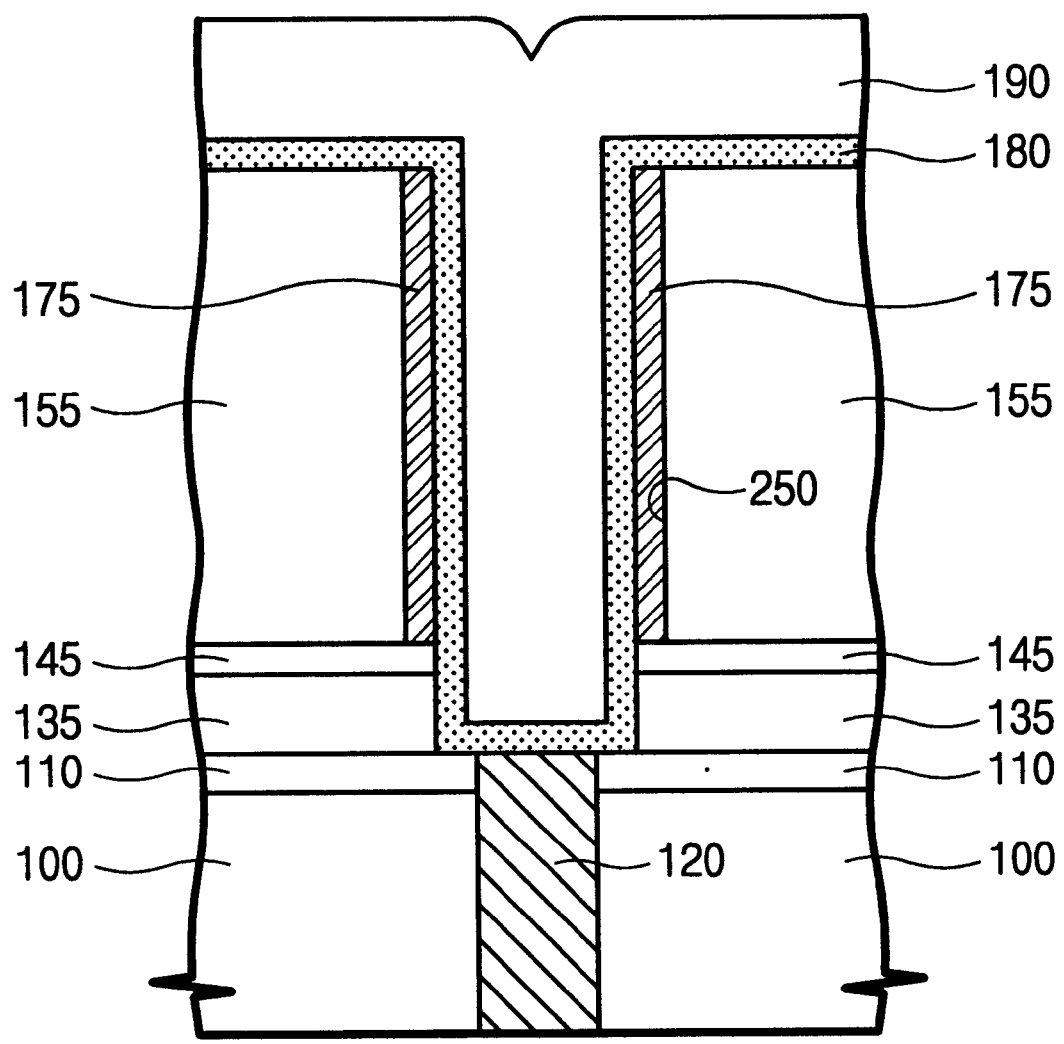

Referring to FIG. 6, a lower electrode layer 180 is conformally formed on an entire surface of the semiconductor substrate including the supporting pattern 135. The lower electrode layer 180 is preferably composed of one of the platinum group such as ruthenium, rhodium, palladium, osmium, iridium, or platinum, using CVD or ALD.

A sacrificial layer 190 is formed on the lower electrode layer 180. The sacrificial layer 190 is preferably composed of a material the etch rate of which is the same as, or higher than that of, the molding pattern 155 in an etch recipe for etching an oxide layer. Also, the sacrificial layer 190 is preferably a material capable of completely filling the hole region 300 covered with the lower electrode layer 180. For this, the sacrificial layer 190 is preferably formed of an SOG material, which exhibits both a suitable gap fill characteristic and a high etch rate.

Meanwhile, in the case that the lower electrode 180 formed of ruthenium or the like contains oxygen, the oxygen may oxidize the contact plug 120. If the contact plug 120 is oxidized, a contact failure is generated between the contact plug 120 and the lower electrode. Accordingly, it is preferable to further performing a process of removing oxygen contained in the lower electrode 180. For this, after forming the lower electrode layer 180, a thermal process is further performed in a hydrogen ambient.

Figure 7:
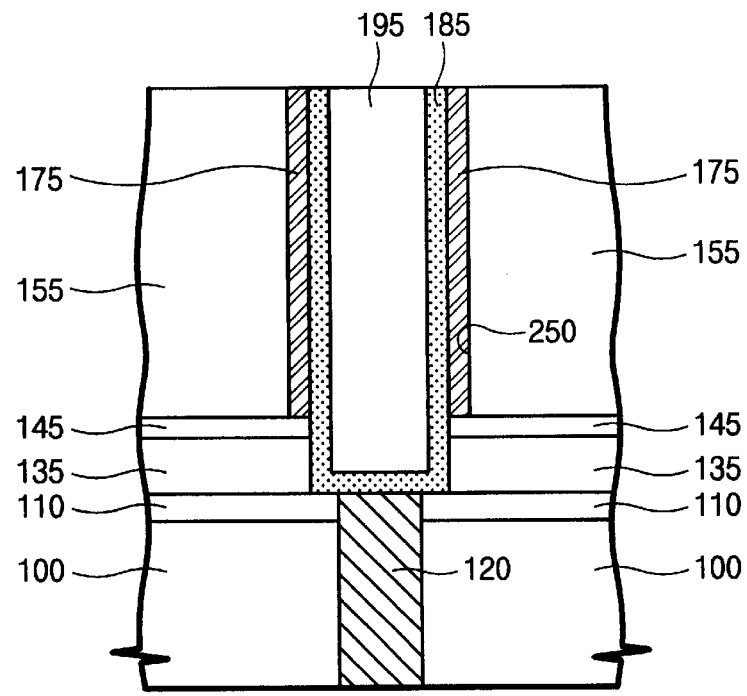

Referring to FIG. 7, the sacrificial layer 190 and the lower electrode layer 180 are planarizingly etched until the molding pattern 155 is exposed, thereby forming a sacrificial pattern 195 and a lower electrode 185.

The planarizing etching process is preferably conducted using CMP. Thus, the lower electrode 185 covers an inner wall of the hole region 300. At this time, the lower electrode 185 formed of the ruthenium and the like is in contact not only with the molding pattern 155 but also with the sidewalls of the adhesive spacer 175. Accordingly, it is capable of solving the conventional problem that an etchant penetrates through an interface between the lower electrode 185 and the molding pattern 155.

Also, the sacrificial pattern 195 fills an remaining space of the hole region where the lower electrode 185 is formed. Thus, the lower electrode 185 exhibits a shape of a cylindrical pipe with a bottom, and the sacrificial pattern 195 exhibits a shape of a circular column filling the lower electrode 185.

Figure 8:
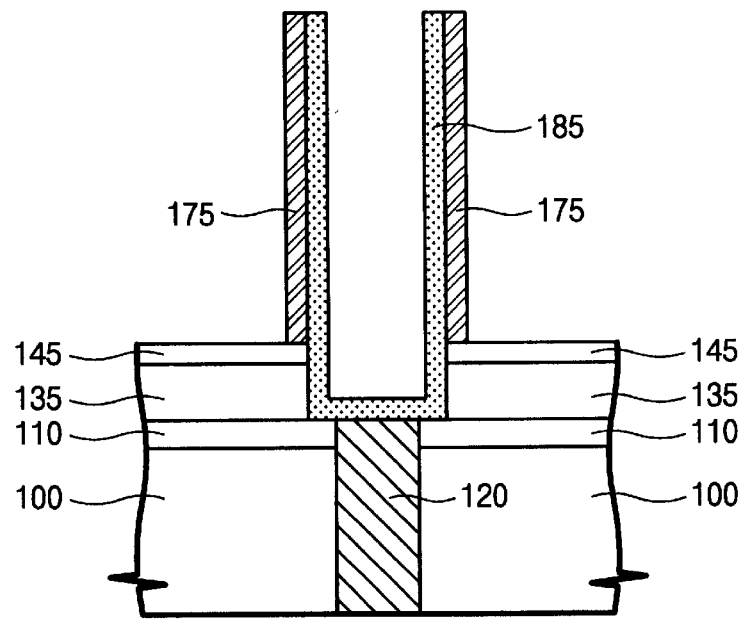

Referring to FIG. 8, the molding pattern 155 and the sacrificial pattern 195 are removed using an etch recipe having an etch selectivity with respect to the lower electrode 185, the adhesive spacer 175, and the etch stop pattern 145. The removal process is performed using an isotropic etch process, preferably a wet etch process. As described above, the molding pattern 155 and the sacrificial pattern 195 are typically formed of oxides, the removal process preferably employs an etchant containing fluoric acid (HF). Thus, a top surface of the etch stop pattern 145, an outer wall of the adhesive spacer 175, and an inner wall of the lower electrode 185 are exposed.

At this time, because the supporting pattern 135 is covered with the etch stop pattern 145 and the lower electrode 185, the supporting pattern 135 is not recessed while the molding pattern 155 is removed. In particular, the adhesive spacer 175 composed of a titanium nitride layer covers an outer wall of the lower electrode 185 on the etch stop pattern 145.

The titanium nitride layer has good adhesion with both the silicon nitride layer and the silicon oxide layer. Further, the titanium nitride layer has a relatively better adhesion with ruthenium as compared to the silicon oxide layer. Thus, the adhesive spacer 175 prevents the etchant from penetrating into the supporting pattern 135 during the etching process for removing the molding pattern 155. As a result, it is possible to avoid the conventional problem of etching of the supporting pattern 135 and, thus, avoid sinking of the lower electrode 185.

The process of removing the molding pattern 155 and the sacrificial pattern 195 may be performed in different process steps, in the case that the sacrificial pattern 195 and the molding pattern 155 are composed of different materials. Preferably, removal of the sacrificial pattern 195 is followed by removal of the molding pattern 155.

Figure 9:
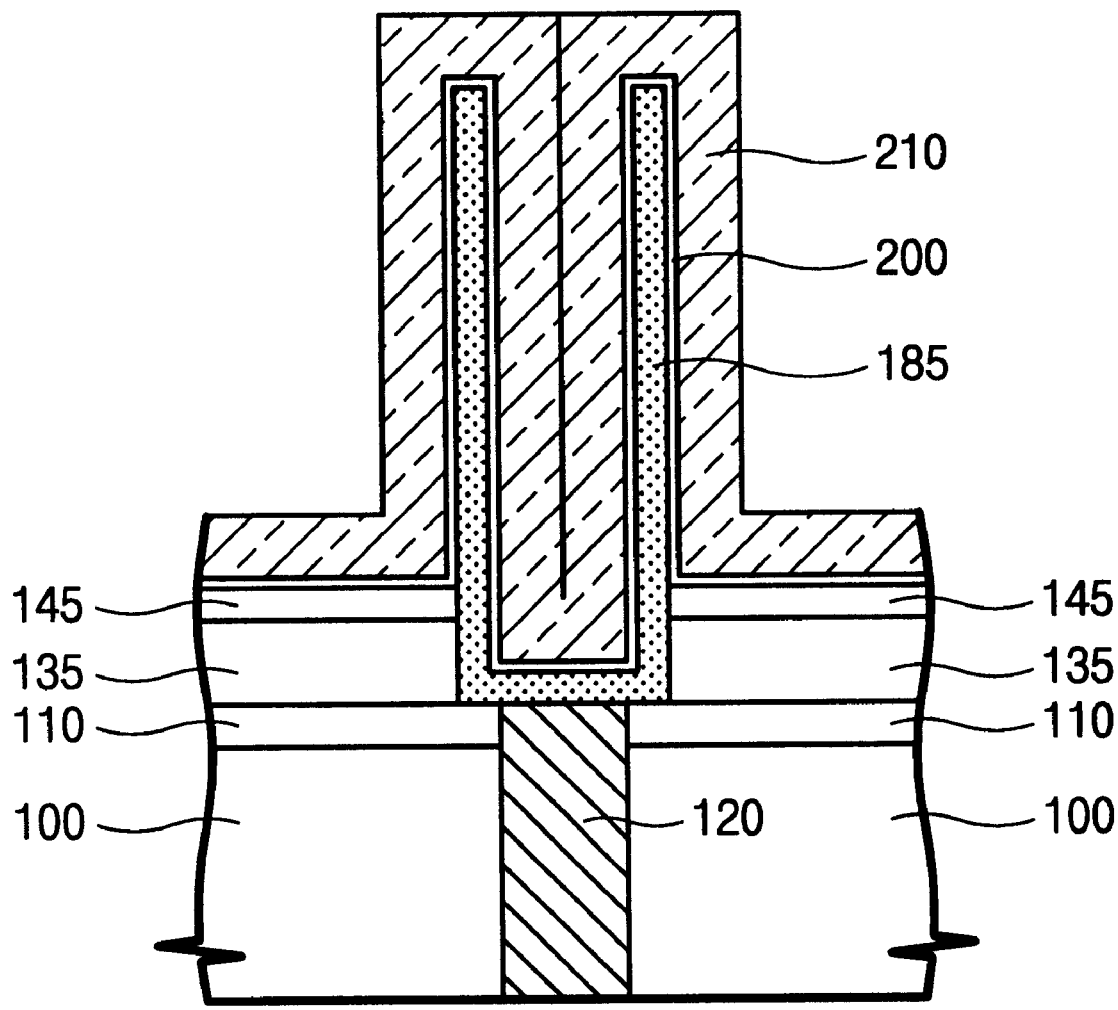

Referring to FIG. 9, a dielectric layer 200 and an upper electrode layer 210 are sequentially formed on an entire surface of the semiconductor substrate where the molding pattern 155 and the sacrificial pattern 195 are removed.

As mentioned in the Background of the Invention section above, in order to secure a sufficient capacitance of a capacitor in highly integrated devices, the dielectric layer 200 is preferably composed of a material layer having a high dielectric constant, such as a tantalum oxide layer ($Ta_2O_5$) and a BST layer.

Also, the upper electrode 210 is preferably composed of one of the platinum group such as ruthenium, rhodium, palladium, osmium, iridium, or platinum, using CVD or ALD.

Thereafter, the upper electrode layer 210 and the dielectric layer 200 are patterned to expose a top surface of the etch stop pattern 145, thereby forming a dielectric pattern and an upper electrode, which sequentially cover the lower electrode 185. Meanwhile, after forming the dielectric layer 200 and the upper electrode layer 210, a thermal process may be further performed so as to improve characteristics of layers and to remove defects.

According to the present invention, an adhesive spacer contacting an outer wall of a lower electrode on an etch stop pattern is formed. The adhesive spacer is composed of a material having beneficial adhesion and high etch selectivity with respect to the etch stop pattern and the lower electrode, like titanium nitride. Thus, the spacer is capable of preventing etchant from penetrating into a supporting pattern to recess the supporting pattern. This enables fabrication of a capacitor having a lower electrode that is stably supported by the supporting pattern.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming a capacitor comprising:
   forming a contact plug penetrating an interlayer dielectric on a semiconductor substrate;
   sequentially forming a supporting layer, an etch stop layer, and a molding layer on the interlayer dielectric including the contact plug;
   patterning the molding layer to form a molding pattern having an opening that exposes the etch stop layer over the contact plug;
   forming an adhesive spacer on sidewalls of the opening;
   successively patterning the etch stop layer and the supporting layer under the opening where the adhesive spacer is formed to form an etch stop pattern and a supporting pattern that expose the contact plug;
   forming a lower electrode covering sidewalls of the adhesive spacer, the etch stop pattern, the supporting pattern, and a top surface of the contact plug;
   removing the molding pattern and the adhesive spacer to expose an outer wall of the lower electrode; and
   sequentially forming a dielectric pattern and an upper electrode covering the exposed outer wall of the lower electrode.

2. The method as claimed in claim 1, wherein the supporting layer is formed of a silicon oxide layer.

3. The method as claimed in claim 1, wherein the etch stop layer is formed of a silicon nitride layer ($Si_3N_4$) or a tantalum oxide layer ($Ta_2O_5$) for preventing recess of the supporting pattern during removal of the molding pattern.

4. The method as claimed in claim 1, wherein the molding layer is formed of a silicon oxide layer or an SOG material.

5. The method as claimed in claim 1, wherein the adhesive spacer is formed of a titanium nitride layer (TiN).

6. The method as claimed in claim 1, wherein forming the adhesive spacer comprises:
   forming an adhesive layer on an entire surface of the semiconductor substrate including the molding pattern; and
   anisotropically etching the adhesive layer to expose top surfaces of the molding pattern and the contact plug.

7. The method as claimed in claim 1, wherein forming the etch stop pattern and the supporting pattern is performed by successively anisotropic-etching the etch stop layer and the supporting layer by using the adhesive spacer and the molding pattern as an etch mask.

8. The method as claimed in claim 1, wherein the lower electrode comprises one of the platinum group including ruthenium, rhodium, palladium, osmium, iridium, and platinum.

9. The method as claimed in claim 1, wherein forming the lower electrode comprises:
   sequentially forming a lower electrode layer and a sacrificial layer on an entire surface of the semiconductor substrate including the supporting pattern;
   etching back the sacrificial layer and the lower electrode layer until a top surface of the molding pattern is exposed, to form a sacrificial pattern and the lower electrode.

10. The method as claimed in claim 9, further comprising removing the sacrificial pattern to expose an inner wall of the lower electrode, after forming the lower electrode.

11. The method as claimed in claim 9, wherein the sacrificial pattern is removed together while the molding pattern is removed.

12. The method as claimed in claim 1, further comprising performing a thermal process in a hydrogen ambient, after forming the lower electrode.

13. The method as claimed in claim 1, wherein removing the molding pattern is performed using an etch recipe having an etch selectivity with respect to the etch stop pattern, the adhesive spacer, and the lower electrode.

14. The method as claimed in claim 1, wherein removing the molding pattern is performed using an isotropic etch process.

15. The method as claimed in claim 1, wherein removing the adhesive spacer is performed using an isotropic etch process.

16. The method as claimed in claim 1, wherein removing the adhesive spacer is performed using an etch recipe having an etch selectivity with respect to the lower electrode and the etch stop pattern.

17. The method as claimed in claim 1, wherein removing the adhesive spacer adopts a solution mixture of sulfuric acid ($H_2SO_4$) and hydrogen peroxide ($H_2O_2$) for an etchant.

18. The method as claimed in claim 1, wherein forming the dielectric pattern and the upper electrode comprises:

sequentially forming a dielectric layer and an upper electrode layer on an entire surface of the semiconductor substrate where the adhesive spacer is removed; and patterning the upper electrode layer and the dielectric layer to form a dielectric pattern and an upper electrode, which cover the exposed surface of the lower electrode.

19. The method as claimed in claim 18, further comprising applying a thermal process to the dielectric layer and the upper electrode layer.

20. The method as claimed in claim 1, wherein the dielectric layer is formed of a tantalum oxide layer.

* * * * *